(12) United States Patent
Jang et al.

(10) Patent No.: US 12,317,415 B2
(45) Date of Patent: May 27, 2025

(54) STRETCHABLE SUBSTRATE AND METHOD OF CONTROLLING DEVICE SPACING USING THE SAME

(71) Applicants: KOREA INSTITUTE OF MACHINERY & MATERIALS, Daejeon (KR); CENTER FOR ADVANCED META-MATERIALS, Daejeon (KR)

(72) Inventors: Bongkyun Jang, Daejeon (KR); Sejeong Won, Daejeon (KR); Jae-Hyun Kim, Daejeon (KR); Hak Joo Lee, Daejeon (KR); Seung-Mo Lee, Daejeon (KR); Kwangseop Kim, Daejeon (KR); Ah Hyun Park, Daejeon (KR)

(73) Assignees: KOREA INSTITUTE OF MACHINERY & MATERIALS, Daejeon (KR); CENTER FOR ADVANCED META-MATERIALS, Daejeon (KR)

( * ) Notice: Subject to any disclaimer, the term of this patent is extended or adjusted under 35 U.S.C. 154(b) by 195 days.

(21) Appl. No.: 18/024,360

(22) PCT Filed: Aug. 31, 2021

(86) PCT No.: PCT/KR2021/011708
§ 371 (c)(1),
(2) Date: Mar. 2, 2023

(87) PCT Pub. No.: WO2022/050667
PCT Pub. Date: Mar. 10, 2022

(65) Prior Publication Data
US 2023/0300974 A1 Sep. 21, 2023

(30) Foreign Application Priority Data
Sep. 3, 2020 (KR) .......................... 10-2020-0112696

(51) Int. Cl.
*H05K 1/02* (2006.01)
(52) U.S. Cl.
CPC .................................. *H05K 1/0283* (2013.01)
(58) Field of Classification Search
CPC .......... H05K 1/0283; H05K 2201/0909; H05K 1/0286
See application file for complete search history.

(56) References Cited

U.S. PATENT DOCUMENTS

| 6,743,982 B2 * | 6/2004 | Biegelsen ........... H01L 25/0655 |
| | | 257/E23.177 |
| 7,001,569 B2 * | 2/2006 | Saitoh .................... H01L 23/15 |
| | | 257/E23.009 |

(Continued)

FOREIGN PATENT DOCUMENTS

| JP | 2015198102 | 11/2015 |
| JP | 2020047959 | 3/2020 |

(Continued)

*Primary Examiner* — Binh B Tran
*Assistant Examiner* — Muhammed Azam
(74) *Attorney, Agent, or Firm* — LEX IP MEISTER, PLLC (57) ABSTRACT

A stretchable substrate includes a cell and an electrode wiring. The cell is divided by cutting lines to form a plurality of cells. The electrode wiring is continuously provided on the plurality of cells not to cross the cutting line. A cell is connected to a neighboring cell by a connection portion in which a cutting line is not formed, and when a tensile force is applied, the cell is hinge-rotated around the connection portion, and the electrode wiring maintains a continuous state even when the cell is hinged.

10 Claims, 8 Drawing Sheets

(56) References Cited

U.S. PATENT DOCUMENTS

| | | | | |
|---|---|---|---|---|
| 7,491,892 | B2* | 2/2009 | Wagner | H05K 1/11 174/254 |
| 7,557,367 | B2* | 7/2009 | Rogers | H01L 21/6835 257/40 |
| 7,635,755 | B2* | 12/2009 | Kaplan | D01D 5/0007 530/353 |
| 7,660,126 | B2* | 2/2010 | Cho | H01R 35/02 174/254 |
| 8,084,117 | B2* | 12/2011 | Lalvani | B32B 29/00 52/670 |
| 8,207,473 | B2* | 6/2012 | Axisa | B32B 37/185 219/121.72 |
| 8,217,381 | B2* | 7/2012 | Rogers | H01L 21/4846 257/40 |
| 8,469,741 | B2* | 6/2013 | Oster | H01R 13/2421 439/586 |
| 8,484,836 | B2* | 7/2013 | Lanzara | H05K 1/0283 174/253 |
| 8,552,299 | B2* | 10/2013 | Rogers | H01L 21/4867 174/254 |
| 8,624,124 | B2* | 1/2014 | Koo | H05K 1/0283 174/117 FF |
| 8,883,287 | B2* | 11/2014 | Boyce | B29C 59/16 174/254 |
| 9,391,286 | B1* | 7/2016 | Kwon | H10K 50/858 |
| 9,502,734 | B1* | 11/2016 | Lim | H01M 4/02 |
| 9,536,860 | B2* | 1/2017 | Yoon | H10K 77/00 |
| 9,554,484 | B2* | 1/2017 | Rogers | H05K 1/189 |
| 9,613,911 | B2* | 4/2017 | Rogers | H01L 23/538 |
| 9,788,789 | B2* | 10/2017 | Bailey | A61B 5/681 |
| 9,790,929 | B2* | 10/2017 | Choi | H01B 5/14 |
| 9,799,708 | B2* | 10/2017 | Hong | H10K 59/121 |
| 10,034,370 | B2* | 7/2018 | Iwase | H05K 1/0283 |
| 10,143,081 | B2* | 11/2018 | Wang | H05K 1/0283 |
| 10,405,432 | B2* | 9/2019 | Letizia | H05K 1/0283 |
| 10,497,633 | B2* | 12/2019 | Rogers | H05K 1/0283 |
| 10,538,028 | B2* | 1/2020 | Rogers | B32B 27/283 |
| 10,720,261 | B2* | 7/2020 | Majidi | H05K 1/095 |
| 11,264,578 | B2* | 3/2022 | Park | H05K 1/0283 |
| 11,328,658 | B2* | 5/2022 | Wu | G06F 1/3218 |
| 11,569,464 | B2* | 1/2023 | Park | H10K 50/8445 |
| 11,596,329 | B2* | 3/2023 | Rogers | G01N 33/50 |
| 11,646,482 | B2* | 5/2023 | Kim | H01Q 1/44 345/173 |
| 11,659,655 | B2* | 5/2023 | Fan | H05K 1/0283 174/254 |
| 11,683,968 | B2* | 6/2023 | Hong | H10K 59/121 257/40 |
| 11,729,905 | B2* | 8/2023 | Hsu | H05K 1/0283 174/254 |
| 11,953,387 | B2* | 4/2024 | ?zer | G01L 1/22 |
| 12,074,213 | B2* | 8/2024 | Nuzzo | H01L 24/03 |
| 2010/0143848 | A1* | 6/2010 | Jain | B23K 26/40 430/311 |
| 2010/0238636 | A1* | 9/2010 | Mascaro | H05K 3/143 361/749 |
| 2012/0052268 | A1* | 3/2012 | Axisa | H01L 23/49838 428/212 |
| 2014/0034364 | A1* | 2/2014 | Kang | H05K 3/0041 264/432 |
| 2014/0299362 | A1* | 10/2014 | Park | H05K 1/0283 174/254 |
| 2015/0342523 | A1* | 12/2015 | Baik | A61B 5/6831 600/595 |
| 2016/0066411 | A1* | 3/2016 | Hong | H05K 1/0283 174/254 |
| 2023/0298489 | A1* | 9/2023 | Jang | H05K 1/02 361/679.01 |
| 2023/0300974 | A1* | 9/2023 | Jang | H05K 3/34 361/749 |

FOREIGN PATENT DOCUMENTS

| | | |
|---|---|---|
| JP | 2020107660 | 7/2020 |
| KR | 10-2010-0121965 | 11/2010 |
| KR | 10-2013-0075484 | 7/2013 |
| KR | 1020160110689 | 9/2016 |
| KR | 2017-0033753 | 3/2017 |
| KR | 10-1768675 | 8/2017 |
| KR | 10-2020-0049949 | 5/2020 |
| KR | 10-2020-0082370 | 7/2020 |
| KR | 102169470 | * 10/2020 |

* cited by examiner

STRETCHABLE SUBSTRATE AND METHOD OF CONTROLLING DEVICE SPACING USING THE SAME

TECHNICAL FIELD

The present invention relates to a stretchable substrate and a method of controlling a device spacing using the same, and more particularly, to a stretchable substrate allowing various pitch adjustment for devices thereon, and a method of controlling a device spacing using the same.

BACKGROUND ART

In general, high-performance devices using a semiconductor process are implemented on a wafer substrate through various methods, such as a coating process, an exposure process, a developing process, an etching process, a thin film process, an ion implantation process, an oxidation process, and a diffusion process, based on a wafer. Parts are shaped through packaging processes, such as dicing, die bonding, wire bonding, and molding. Common semiconductors, memory chips, etc. are produced through such processes.

Meanwhile, attempts have been made to manufacture flexible device parts based on printed electronics technology, and examples of application thereof to some product groups, such as displays, RFID, and photovoltaic power generation, have been introduced. Printed electronics technology is generally conducted at a relatively low temperature or room temperature compared to a semiconductor process, and devices are manufactured by a coating process, a printing process, a patterning process, etc. and post-processing for wiring and electrode formation and processes, such as bonding and cutting are performed to obtain flexible parts.

When manufacturing a device using devices, wiring and a space for other purposes are required. That is, a space is required between devices, and here, if all devices are transferred to a target substrate at once, a space cannot be formed between the devices, which may lead to difficulties in device manufacturing.

In addition, when a device includes several types of devices, instead of a single type of device, after transferring one device, another device has to be transferred in the vicinity thereof. As can be seen from these examples, a process of selectively transferring a device is often required in a device transfer process for device manufacturing.

Meanwhile, a related art technology for selectively transferring devices may greatly widen the spacing between devices, but it is difficult to precisely control the spacing between devices, and while it is possible to adjust the spacing between devices by an integer multiple, it is difficult to adjust the spacing by a decimal multiple or control the spacing to an interval of 2 times or less.

In addition, in the conventional technology for selectively transferring a device, a stamp to which a device is attached should be deformed in a biaxial direction in consideration of the Poisson's ratio. However, in the case of the biaxial deformation, a region in which strain is uniformly formed is narrow, causing a problem in that it is difficult to uniformly adjust intervals between devices adhered to the stamp as a whole.

DISCLOSURE

Technical Problem

The present invention has been made in an effort to provide a stretchable substrate having advantages of allowing varous pitch adjustment for devices thereon, and a method of controlling a device spacing using the same.

The technical problems to be achieved by the present invention are not limited to the technical problems mentioned above, and other technical problems not mentioned may be clearly understood by those skilled in the art to which the present invention pertains from the description below.

Technical Solution

An exemplary embodiment of the present invention provides a stretchable substrate including a plurality of cells divided by a cutting line and an electrode wiring continuously provided on the plurality of cells not to intersect the cutting line, wherein a cell is connected to a neighboring cell by a connection portion in which the cutting line is not formed, and when a tensile force is applied, the cell is hinge-rotated around the connection portion, and the electrode wiring maintains a continuous state even when the cell is hinge-rotated.

In an exemplary embodiment of the present invention, the electrode wiring may include a first electrode wire and a second electrode wire formed along the sides of the cells to pass through the connection portion formed between the neighboring cells, and the first electrode wire and the second electrode wire may not cross each other.

In an exemplary embodiment of the present invention, the stretchable substrate may further include: a first lead wire extending from the first electrode wire to an inside of the cell; a second lead wire extending from the second electrode wire to the inside of the cell, wherein relative positions of the first lead wire and the second lead wire are the same in an initial state in which each of the cells is not hinge-rotated.

In an exemplary embodiment of the present invention, the electrode wiring may include a third electrode wire and a fourth electrode wire formed to cross the inside of the cell to pass through the connection portion formed between the neighboring cells, and the third electrode wire and the fourth electrode wire may cross each other.

In an exemplary embodiment of the present invention, an insulating layer may be provided between the third electrode wire and the fourth electrode wire at a point where the third electrode wire and the fourth electrode wire intersect each other.

In an exemplary embodiment of the present invention, the stretchable substrate may further include: a third lead wire extending from the third electrode wire to the inside of the cell; a fourth lead wire extending from the fourth electrode wire to the inside of the cell, wherein, relative positions of the third lead wire and the fourth lead wire are the same in an initial state in which each of the cells is not hinge-rotated.

In an exemplary embodiment of the present invention, the cell and the connection portion may be formed of different materials, and the connection portion may have a second critical strain greater than a first critical strain of the cell.

In an exemplary embodiment of the present invention, the connection portion may be formed of a conductive material, and the electrode wiring may be formed between the connection portions so that both end portions are connected to the adjacent connection portions.

In an exemplary embodiment of the present invention, the cutting line may include a first cutting line formed in a first direction and a second cutting line formed on both sides of the first cutting line in a direction intersecting the first cutting line to be spaced apart from the first cutting line.

Another exemplary embodiment of the present invention provides a method of controlling a device spacing using a stretchable substrate including: a device preparing operation of providing a device to be connected to the electrode wiring of the stretchable and arranged at a first interval; and a interval adjusting operation of applying a tensile force to the stretchable substrate to hinge-rotate the cell around the connection portion so that the device is adjusted to have a second interval greater than the first interval.

Advantageous Effects

According to an exemplary embodiment of the present invention, when an elastic sheet is deformed to be elongated in a first direction, deformation occurs so that the elastic sheet is elongated in the second direction, and here, deformation in the first direction and deformation in the second deformation may be equal, so that a pitch of a mounted device may be controlled to increase as a whole uniformly.

In addition, according to an exemplary embodiment of the present invention, a hinge rotation angle of the cell may be adjusted to vary, so that pitches between mounted devices may be adjusted to vary.

In addition, according to an exemplary embodiment of the present invention, a connection portion may be formed of a material having a critical strain is greater than that of the cell, and accordingly, plastic deformation or breakage of the connection portion may be prevented, and thus the durability of the stretchable substrate may be improved.

It should be understood that the effects of the present invention are not limited to the effects mentioned above, and include all effects that may be inferred from the configuration of the present invention described in the detailed description or claims of the present invention.

MODE FOR INVENTION

Hereinafter, the present invention will be described with reference to the accompanying drawings. As those skilled in the art would realize, the described exemplary embodiments may be modified in various different ways, all without departing from the scope of the present invention. Accordingly, the drawings and description are to be regarded as illustrative in nature and not restrictive. Like reference numerals designate like elements throughout the specification.

Throughout this specification and the claims that follow, when it is described that an element is "connected (accessed, contact, and coupled)" to another element, the element may be "directly connected" to the other element and "indirectly connected" to the other element through a third element. Throughout the specification, unless explicitly described to the contrary, the word "comprise" and variations, such as "comprises" or "comprising" will be understood to imply the inclusion of stated elements but not the exclusion of any other elements.

Terms used in the present specification are used only in order to describe specific exemplary embodiments rather than limiting the present invention. Singular forms are intended to include plural forms unless the context clearly indicates otherwise. It will be further understood that the terms "comprises" or "have" used in this specification, specify the presence of stated features, numerals, components, parts, or a combination thereof, but do not preclude the presence or addition of one or more other features, numerals, components, parts, or a combination thereof.

Hereinafter, exemplary embodiments of the present invention will be described in detail with reference to the accompanying drawings.

Figure 1:
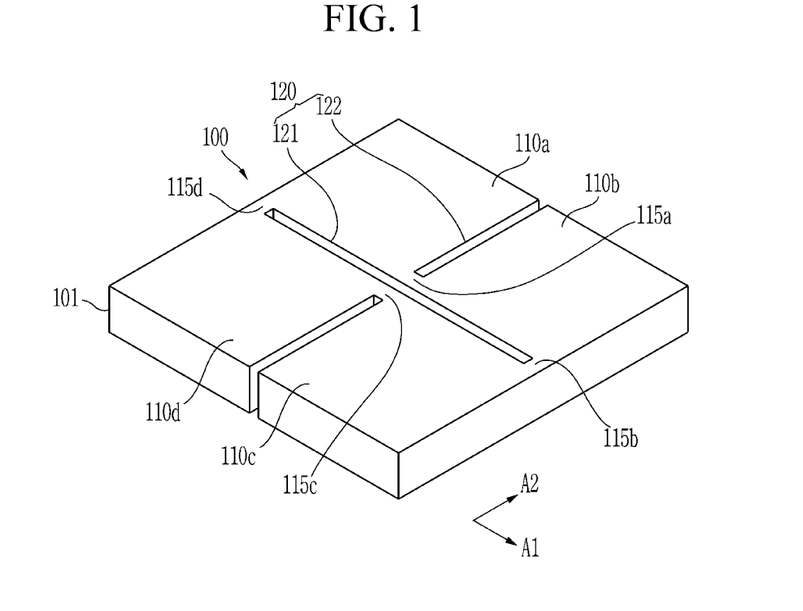
FIG. 1 is an exemplary view illustrating a cell of a stretchable substrate according to a first exemplary embodiment of the present invention.
Figure 2:
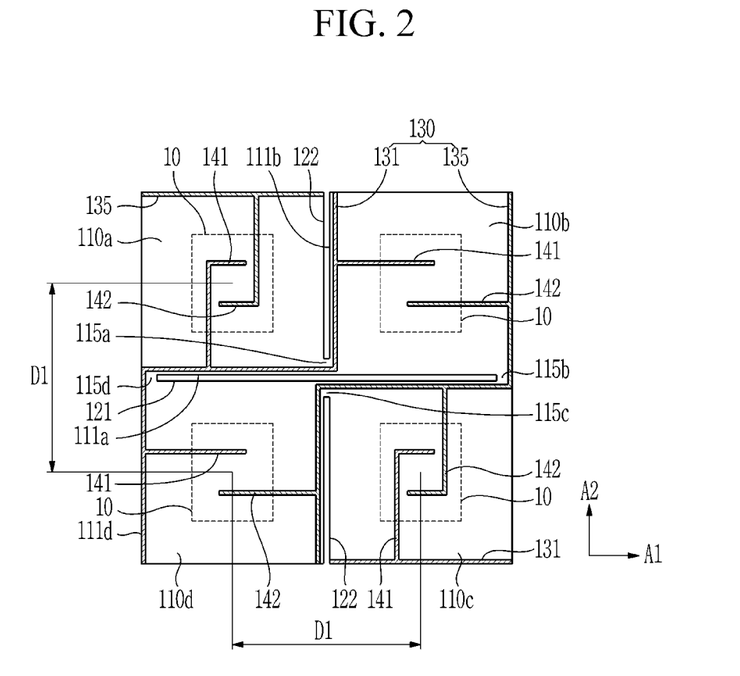
FIG. 2 is a plan view illustrating electrode wirings and devices provided on the stretchable substrate of FIG. 1.
Figure 3:
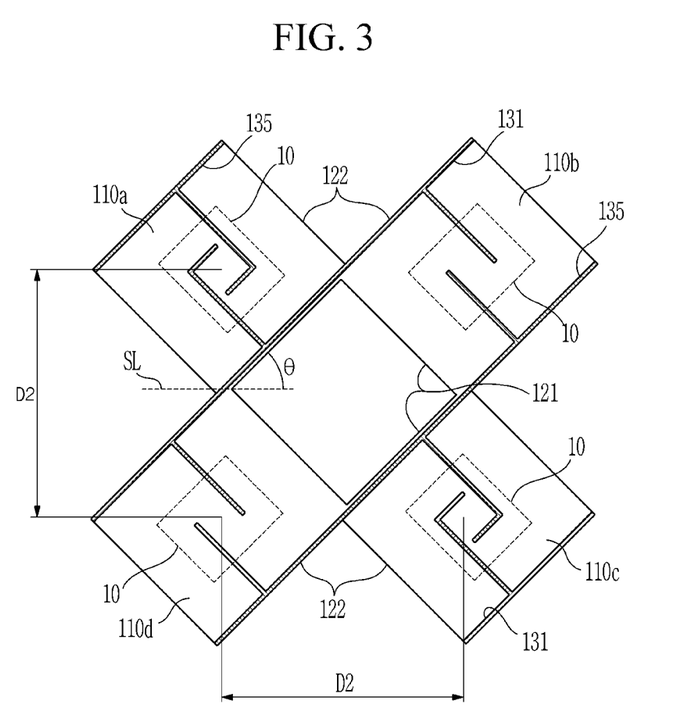
FIG. 3 is an exemplary view illustrating a state in which the stretchable substrate of FIG. 2 is deformed by a tensile force applied thereto.

FIG. 1 is an exemplary view illustrating a cell of a stretchable substrate according to a first exemplary embodiment of the present invention, FIG. 2 is a plan view illustrating electrode wirings and devices provided on the stretchable substrate of FIG. 1, and FIG. 3 is an exemplary view illustrating a state in which the stretchable substrate of FIG. 2 is deformed by a tensile force applied thereto.

As shown in FIGS. 1 to 3, a stretchable substrate 100 may include cells 110a, 110b, 110c, and 110d and an electrode wiring 130.

The cells 110a, 110b, 110c, and 110d may be formed by dividing a substrate body 101 of the stretchable substrate by a cutting line 120.

Hereinafter, a case in which the cutting line 120 has a first cutting line 121 and a second cutting line 122 and the cells 110a, 110b, 110c, and 110d have a quadrangular shape is described as an example, but the shapes of the cutting line and the cells are not limited thereto, and as long as the cells formed by a cutting line (to be described below) are hinge-rotated and resultant effects are implemented to be similar or the same, the shapes of the cutting line and the cells are not particularly limited.

The first cutting line 121 may be formed in the substrate body 101 in a first direction A1 to divide the substrate body 101. Here, the first cutting line 121 may be formed to have a length shorter than a length of the substrate body 101 in the first direction A1 so that the substrate body 101 is not completely separated by the first cutting line 121.

The second cutting line 122 may be formed on both sides of the first cutting line 121 to be spaced apart from the first cutting line 121. The second cutting line 122 may be formed in a direction intersecting the first cutting line 121. In this case, the second cutting line 122 does not directly intersect the first cutting line 121, but an imaginary extension line of the second cutting line 122 may be formed to intersect the first cutting line 121. The second cutting line 122 is not formed to completely separate the substrate body 101.

When the second cutting line 122 crosses the center of the first cutting line 121 and is formed to be perpendicular to the first cutting line 121 and the sum of the lengths of the second cutting line 122 is equal to the length of the first cutting line 121, the cells 110a, 110b, 110c, and 110d may be formed to have the same area by the first cutting line 121 and the second cutting line 122. By adjusting the length and formation position of the first cutting line 121 and the second cutting line 122, the areas of the cells may be variously adjusted.

The cells 110a, 110b, 110c, and 110d are divided by the cutting line but are not completely separated from each other, and neighboring cells may be connected to each other through a connection portion formed therebetween. For example, the cells 110a and 110b adjacent to each other in the first direction A1 may be connected to each other through a connection portion 115a formed therebetween, and other cells 110c and 110d adjacent to each other in the first direction A1 may be connected to each other through a connection portion 115c formed therebetween. In addition, the cells 110a and 110d adjacent to each other in the second direction A2 may be connected to each other through a connection portion 115d formed therebetween, and other cells 110b and 110c adjacent to each other in the second direction A2 may be connected to each other through a connection portion 115b formed therebetween.

Also, when a tensile force is applied to the upper cells 110a and 110b in an upward direction and a tensile force is applied to the lower cells 110c and 110d in a downward direction, the first cutting line 121 and the second cutting line 122 may be spread out and each cell 110a, 110b, 110c, and 110d may be hinge-rotated around a corresponding connection portion. When each of the cells 110a, 110b, 110c, and 110d is hinge-rotated around the corresponding connection portion, an interval between the centers of the respective cells 110a, 110b, 110c, and 110d may increase.

That is, as shown in FIG. 2, when an interval between the cells 110a, 110b, 110c, and 110d is a first interval D1 in an initial state in which the respective cells 110a, 110b, 110c, and 110d are not hinge-rotated, an interval between the cells 110a, 110b, 110c, and 110d may be a second interval D2 greater than the first interval D1 when the cells 110a, 110b, 110c, and 110d are hinge-rotated as shown in FIG. 3.

In the stretchable substrate of the related art, deformation occurs according to Poisson's ratio in which, when deformation occurs in one direction, deformation decreases in a direction perpendicular thereto.

Of course, the stretchable substrate of the related art may be deformed to stretch both in one direction and in a direction perpendicular thereto, but even in this case, the amount of deformation elongated in a center portion of the stretchable substrate and the amount of deformation elongated in the edge portion of the stretchable substrate are different. Accordingly, when a pitch between devices is adjusted using the stretchable substrate of the related art, pitches between the devices vary for each region. That is, it is difficult to control the pitches between devices provided on the stretchable substrate to uniformly increase as a whole.

In contrast, when the stretchable substrate according to the present invention is deformed to be elongated in the first direction A1, the stretchable substrate may also be deformed to be elongated in the second direction A2, and in this case, deformation in the first direction A1 and deformation in the second direction A2 may also be the same. Accordingly, in the case of using the stretchable substrate according to the present invention, the pitches between the devices may be controlled to uniformly increase as a whole.

The relationship between the first interval D1 and the second interval D2 according to the hinge rotation of the cells 110a, 110b, 110c, and 110d may be expressed by Equation (1) below.

$$D2 = D1(\sin\theta + \cos\theta) \qquad \text{Equation 1}$$

Here, $\theta$ is an angle at which the first cutting line 121 is spread out with respect to an imaginary reference line SL in the first direction A1.

Accordingly, the second interval D2 may be controlled by adjusting the angle $\theta$ at which the first cutting line 121 is spread out. For example, the second interval D2 may be adjusted at an interval of an integer multiple or a decimal multiple, and accordingly, pitches between the devices 10 mounted on the stretchable substrate may be adjusted to vary.

The electrode wiring 130 may be continuously provided on the plurality of cells 110a, 110b, 110c, and 110d so as not to intersect the cutting line 120, and even when the cells 110a, 110b, 110c, and 110d are hinge-rotated, the continuous state may be maintained.

The electrode wiring 130 may have a first electrode wire 131 and a second electrode wire 135, and voltages of different polarities may be applied to the first electrode wire 131 and the second electrode wire 135.

The first electrode wire 131 and the second electrode wire 135 may be formed along the side of the cell so as to pass through the connection portion formed between the neighboring cells.

For example, the first electrode wire 131 may be provided along a left side 111d of the cell 110d and pass through a connection portion 115d connected to the adjacent cell 110a in the second direction A2. Also, the first electrode wire 131 may be provided along a lower side 111a of the cell 110a and pass through a connection portion 115a connected to the adjacent cell 110b in the first direction A1, and may be formed along a left side 111b of the cell 110b. In a similar manner, the second electrode wire 135 may be provided along the right side of the cell 110d, may pass through a connection portion 115c connected to the adjacent cell 110c in the first direction A1, may be provided along an upper side of the cell 110c, may pass through a connection portion 115b connected to the cell 110b adjacent in the second direction A2, and may be formed along the right side of the cells 110b. The first electrode wire 131 and the second electrode wire 135 formed in this manner may have a straight shape when the respective cells 110a, 110b, 110c, and 110d are hinge-rotated. Also, since the first electrode wire 131 and the second electrode wire 135 are not connected to each other, there is no risk of a short circuit (refer to FIG. 3).

In addition, the stretchable substrate may further include a first lead wire 141 and a second lead wire 142.

The first lead wire 141 may extend from the first electrode wire 131 to the inside of the corresponding cell. In addition, the second lead wire 142 may extend from the second electrode wire 135 to the inside of the corresponding cell. That is, the first lead wire 141 and the second lead wire 142 may be provided in each of the corresponding cells 110a, 110b, 110c, and 110d, and the first lead wire 141 and the second lead wire 142 may form a pair in each of the cells 110a, 110b, 110c, and 110d.

The relative positions of the first lead wire 141 and the second lead wire 142 may be the same in an initial state in which the cells 110a, 110b, 110c, and 110d are not hinge-rotated as shown in FIG. 2. For example, in each of the cells 110a, 110b, 110c, and 110d, one end portion of the first lead wire 141 may be positioned above one end portion of the second lead wire 142. In this manner, a process of connecting to the device 10 in each cell 110a, 110b, 110c, and 110d may be facilitated. That is, different voltages are applied to the first lead wire 141 and the second lead wire 142, respectively, and if the relative positions of the first lead wire 141 and the second lead wire 142 are different in each of the cells 110a, 110b, 110c, and 110d, the types of voltages applied to the first lead wire 141 and the second lead wire 142 should be checked one by one to connect terminals of the device 10, and if a positive terminal of the device 10 is connected to a lead wire to which a negative voltage is applied are connected, the device may be damaged. However, when the relative positions of the first lead wire 141 and the second lead wire 142 in each of the cells 110a, 110b, 110c, and 110d are the same as described above, the aforementioned inconvenience and risk may be prevented.

Figure 4:
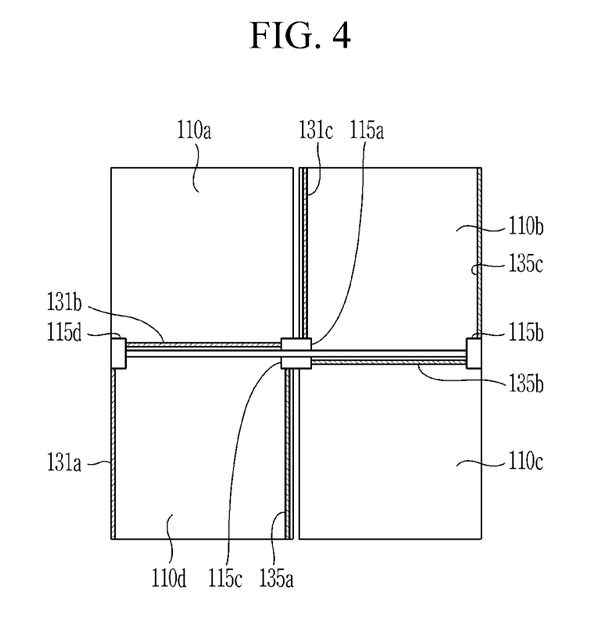
FIG. 4 is a plan view illustrating another example of a connection portion of a stretchable substrate according to the first exemplary embodiment of the present invention.

FIG. 4 is a plan view illustrating another example of a connection portion of a stretchable substrate according to the first exemplary embodiment of the present invention.

As shown in FIG. 4, the cells 110a, 110b, 110c, and 110d and the connection portions 115a, 115b, 115c, and 115d may be formed of different materials. In addition, the connection portions 115a, 115b, 115c, and 115d may have a greater critical strain than the cells 110a, 110b, 110c, and 110d. That is, when the cells 110a, 110b, 110c, and 110d have a first critical strain, the connection portions 115a, 115b, 115c, and 115d may have a second critical strain greater than the first critical strain.

When the cells 110a, 110b, 110c, and 110d are hinge-rotated, the connection portion undergoes the greatest deformation, and thus a high critical strain is required to prevent damage to the connection portion. Therefore, the connection portions 115a, 115b, 115c, and 115d may be formed of a material having a critical strain greater than that of the material of the cells 110a, 110b, 110c, and 110d, to prevent plastic deformation or breakage of the connection portions 115a, 115b, 115c, and 115d, and accordingly, the durability of the stretchable substrate may be improved.

In addition, the connection portions 115a, 115b, 115c, and 115d may be formed of a conductive material, and the electrode wiring may be formed between the connection portions. Taking the first electrode wire as an example, one end portion of the first electrode wire 131a provided in the cell 110d may be connected to the connection portion 115d. In addition, one end portion of the first electrode wire 131b provided in the cell 110a may be connected to the connection portion 115d, the other end portion thereof may be connected to the connection portion 115a, and one end portion of the first electrode wire 131c provided in the cell 110b may be connected to the connection portion 115a. That is, both end portions of the electrode wires provided in each cell may be connected to adjacent connection portions. In a similar manner, one end portion of the second electrode wire 135a provided in the cell 110d may be connected to the connection portion 115c. In addition, one end portion of the second electrode wire 135b provided in the cell 110c may be connected to the connection portion 115c and the other end portion thereof may be connected to the connection portion 115b, and one end portion of the second electrode wire 135c provided in the cell 110b may be connected to the connection portion 115b.

Meanwhile, although four cells 110a, 110b, 110c, and 110d are described as an example of a minimum unit necessary for an effective description of the stretchable substrate, the four cells 110a, 110b, 110c, and 110d described above may be repeatedly extended in the first direction A1 and the second direction A2, and thus, the size of the stretchable substrate may be variously adjusted.

Figure 5:
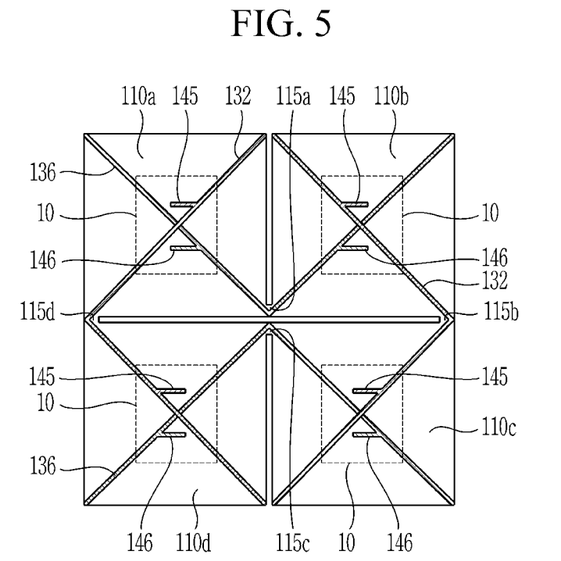
FIG. 5 is a plan view illustrating electrode wirings and devices provided on a stretchable substrate according to a second exemplary embodiment of the present invention.
Figure 6:
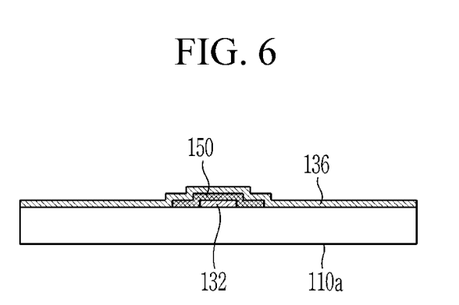
FIG. 6 is a cross-sectional view of a portion where a third lead wire and a fourth lead wire of FIG. 5 intersect.
Figure 7:
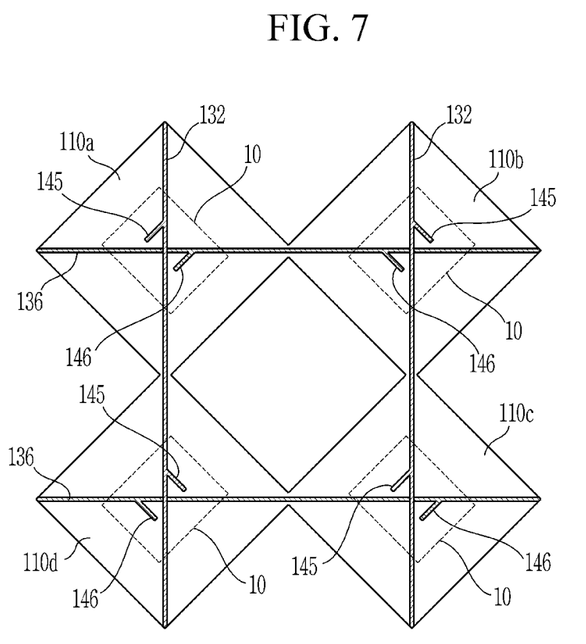
FIG. 7 is an exemplary view illustrating a state in which the stretchable substrate of FIG. 5 is deformed by a tensile force applied thereto.

FIG. 5 is a plan view illustrating electrode wirings and devices provided on a stretchable substrate according to a second exemplary embodiment of the present invention, FIG. 6 is a cross-sectional view of a portion where a third lead wire and a fourth lead wire of FIG. 5 intersect, and FIG. 7 is an exemplary view illustrating a state in which the stretchable substrate of FIG. 5 is deformed by a tensile force applied thereto. In the present exemplary embodiment, the shape of the electrode wiring may be different, while other components are the same as those of the first exemplary embodiment described above, and therefore, repeated descriptions thereof will be omitted.

As shown in FIGS. 5 to 7, the electrode wiring may have a third electrode wire 132 and a fourth electrode wire 136.

The third electrode wire 132 and the fourth electrode wire 136 may be formed across the inside of the cell to pass through the connection portion formed between the neighboring cells.

For example, the third electrode wire 132 may cross the cell 110d from a lower right vertex of the cell 110d, pass through the connection portion 115d connected to the adjacent cell 110a in the second direction A2, and extend to an upper right vertex of 110a. In a similar manner, the fourth electrode wire 136 may cross the cell 110d from a lower left vertex of the cell 110d, pass through the connection portion 115c connected to the adjacent cell 110c in the first direction A1, and extend to a lower right vertex of the cell 110c. The third electrode wire 132 and the fourth electrode wire 136 formed in this manner may have a straight line shape when each cell 110a, 110b, 110c, and 110d is hinge-rotated (refer to FIG. 7).

Meanwhile, in the present exemplary embodiment, since the third electrode wire 132 and the fourth electrode wire 136 are formed to intersect each other inside the cell, there is a risk of a short circuit. To prevent the occurrence of a short circuit, an insulating layer 150 may be provided in the present exemplary embodiment.

The insulating layer 150 may be provided between the third electrode wire 132 and the fourth electrode wire 136 at a point where the third electrode wire 132 and the fourth electrode wire 136 intersect each other, whereby a short circuit between the third electrode wire 132 and the fourth electrode wire 136 may be prevented.

Also, in the present exemplary embodiment, the third lead wire 145 may extend from the third electrode wire 132 to the inside of the cell, and the fourth lead wire 146 may extend from the fourth electrode wire 136 to the inside of the cell, and the third lead wire 145 and the fourth lead wire 146 may form a pair in each of the cells 110a, 110b, 110c, and 110d.

In addition, the relative positions of the third lead wire 145 and the fourth lead wire 146 may be the same in an initial state in which the cells 110a, 110b, 110c, and 110d are not hinge-rotated as in FIG. 5.

Hereinafter, a method for controlling a device spacing using a stretchable substrate will be described.

Figure 8:
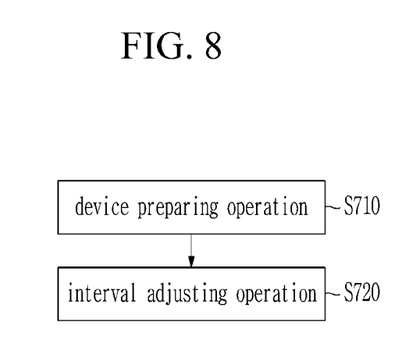
FIG. 8 is a flowchart illustrating a method for controlling a device spacing using a stretchable substrate according to an exemplary embodiment of the present invention.

FIG. 8 is a flowchart illustrating a method for controlling a device spacing using a stretchable substrate according to an exemplary embodiment of the present invention.

As shown in FIG. 8, the method of controlling a device spacing using a stretchable substrate may include a device preparing operation (S710) and an interval adjusting operation (S720).

The device preparing operation (S710) may be an operation of preparing devices to be connected to the electrode wirings of the stretchable substrate and respectively arranged at a first interval.

The interval adjusting step (S720) may be an operation of applying a tensile force to the stretchable substrate to hinge-rotate the cell around the connection portion so that the devices are adjusted to have a second interval greater than the first interval. The second interval may be adjusted at various ratios based on the first interval, according to which the intervals between the devices may be variously controlled.

The above description of the example exemplary embodiments is provided for the purpose of illustration, and it would be understood by those skilled in the art that various changes and modifications may be made without changing technical conception and essential features of the example exemplary embodiments. Thus, it should be understood that the above-described example exemplary embodiments are illustrative in all aspects and do not limit the present invention. For example, each component described to be of a single type may be implemented in a distributed manner. Likewise, components described to be distributed may be implemented in a combined manner.

The scope of the present invention is defined by the appended claims, rather than the detailed description, and should be construed as including all modifications and variations derived from the meaning and scope of the claims and concept equivalent thereto.

| (Description of reference numerals) | |
| --- | --- |
| 10: Device | 100: stretchable substrate |
| 110a, 110b, 110c, 110d: cell | 115a, 115b, 115c, 115d: connection portion |
| 120: cutting line | 121: first cutting line |
| 122: second cutting line | 130: electrode wiring |
| 131: first electrode wire | 132: third electrode wire |
| 135: second electrode wire | 136: fourth electrode wire |
| 141: first lead wire | 142: second lead wire |
| 145: third lead wire | 146: fourth lead wire |
| 150: insulating layer | |

The invention claimed is:

1. A stretchable substrate comprising:
a plurality of cells divided by a cutting line; and
an electrode wiring continuously provided on the plurality of cells not to intersect the cutting line,
wherein a cell is connected to a neighboring cell by a connection portion in which the cutting line is not formed, and when a tensile force is applied, the cell is hinge-rotated around the connection portion, and
the electrode wiring maintains a continuous state even when the cell is hinge-rotated.

2. The stretchable substrate of claim 1, wherein:
the electrode wiring includes a first electrode wire and a second electrode wire formed along sides of the cells to pass through the connection portion formed between the neighboring cells, and
the first electrode wire and the second electrode wire do not intersect each other.

3. The stretchable substrate of claim 2, further comprising:
a first lead wire extending from the first electrode wire to an inside of the cell;
a second lead wire extending from the second electrode wire to the inside of the cell,
wherein relative positions of the first lead wire and the second lead wire are same in an initial state in which each of the cells is not hinge-rotated.

4. The stretchable substrate of claim 1, wherein:
the electrode wiring includes a third electrode wire and a fourth electrode wire formed to cross an inside of the cell to pass through the connection portion formed between the neighboring cells, and
the third electrode wire and the fourth electrode wire intersect each other.

5. The stretchable substrate of claim 4, wherein:
an insulating layer is provided between the third electrode wire and the fourth electrode wire at a point where the third electrode wire and the fourth electrode wire intersect each other.

6. The stretchable substrate of claim 4, further comprising:
a third lead wire extending from the third electrode wire to the inside of the cell;
a fourth lead wire extending from the fourth electrode wire to the inside of the cell,
wherein, relative positions of the third lead wire and the fourth lead wire are the same in an initial state in which each of the cells is not hinge-rotated.

7. The stretchable substrate of claim 1, wherein:
the cell and the connection portion are formed of different materials, and the connection portion has a second critical strain greater than a first critical strain of the cell.

8. The stretchable substrate of claim 7, wherein:
the connection portion is formed of a conductive material, and the electrode wiring is formed between the connection portions so that both end portions are connected to adjacent connection portions.

9. The stretchable substrate of claim 1, wherein:
the cutting line includes:
a first cutting line formed in a first direction; and
a second cutting line formed on both sides of the first cutting line in a direction intersecting the first cutting line to be spaced apart from the first cutting line.

10. A method of controlling a device spacing using a stretchable substrate, the method comprising: providing a device to be connected to the electrode wiring of the stretchable substrate according to claim 1 and arranged at a first interval; and adjusting an interval by applying a tensile force to the stretchable substrate to hinge-rotate the cell around the connection portion so that the device is controlled to have a second interval greater than the first interval.

* * * * *